INVENTOR.
Charles Frank Myers

BY
Mueller, Aichele, & Rauner
ATTY'S.

INVENTOR.
Charles Frank Myers
BY Mueller, Aichele & Rauner
ATTY'S.

3,783,046

METHOD OF MAKING A HIGH-SPEED SHALLOW JUNCTION SEMICONDUCTOR DEVICE

Charles Frank Myers, Scottsdale, Ariz., assignor to Motorola, Inc., Franklin Park, Ill.

Continuation of abandoned application Ser. No. 813,105, Apr. 3, 1969. This application Apr. 22, 1971, Ser. No. 136,559
Int. Cl. H01l 7/34
U.S. Cl. 148—187 11 Claims

ABSTRACT OF THE DISCLOSURE

A shallow junction, high-speed semiconductor structure and method for making same wherein a first or base region of one conductivity type is formed in a semiconductor body using photolithographic processes. Next, one or more oxide layers are vapor deposited at a relatively low temperature on the surface of the structure. An opening is then made in the vapor deposited oxide layers to permit the passage of an impurity therethrough and forms a second, opposite conductivity type emitter region within the first region. Next, a thin layer of oxide is thermally grown over the exposed portion of the base region and over the exposed surface of the vapor deposited oxide layers. Thereafter, one or more openings in the surface oxide are selectively made to permit the formation of electrical contacts to the transistor base region and to other like conductivity type regions in the semiconductor structure. Then, by controllably etching the thin thermally grown oxide layer covering the second or emitter region, the emitter region can be exposed for the purpose of making ohmic contact thereto. According to the present process, the thin layer of thermally grown oxide is "washed out" of the emitter region by controlled etching. Such controlled etching eliminates a critical masking step which otherwise would have been required to make a contact opening for the emitter region. Ohmic contacts can now be made to the base and emitter regions of the structure using conventional techniques such as the evaporation of aluminum. Since all oxide masking is removed after the formation of the base region, the final oxide masking on the surface of the structure is of one uniform thickness.

This is a continuation of application Ser. No. 813,105, filed Apr. 3, 1969, now abandoned.

BACKGROUND OF THE INVENTION

This invention relates generally to the fabrication of semiconductor structures and integrated circuits and more particularly to an improved, high-speed shallow junction structure and process for making same. The term "structure" as used herein is intended to include discrete component semiconductor devices or monolithic and hybrid integrated circuits (IC's).

There are various types of semiconductor fabrication processes wherein thermal oxides have been used as diffusion masks in the formation of transistors and integrated circuits. For example, it has been a common practice to form a mask of a thermal oxide, such as silicon oxide, on a semiconductor wafer for limiting the lateral extent of the base and emitter diffusions of a bipolar transistor. Conventionally, the thermal oxide is retained permanently in place after the above diffusion steps have been completed to protect and stabilize the P-N junctions at their respective points of surface termination on a semiconductor structure. In cases where the thermal silicon oxide diffusion mask is initially patterned to define and limit the lateral extent of the transistor base diffusion and subsequently repatterned (by a subsequent oxide regrowth step) to define and limit the lateral extent of the emitter diffusion, the final oxide retained over the P-N junctions has steps therein. Layers of metallization must be subsequently deposited over these steps to provide electrical ohmic contact to transistors or other passive components such as diffused resistors fabricated within the semiconductor structure.

There is an obvious disadvantage in having these steps in the protective and stabilizing surface oxide on the semiconductor structure. These steps make it difficult to provide good, continuous and adhering metallization patterns on the surface oxide and extending into ohmic contact with the active regions of a transistor, diffused resistor, or the like. An increase in the number of steps in the surface oxide over which a metallization pattern must be deposited increases the likelihood of cracks, breaks, and other imperfections in the metallization which cause failure of devices and integrated circuits within the semiconductor structure.

In order to overcome the above disadvantages associated with stepped oxides, theree have been several prior art approaches wherein all surface oxide is removed from the semiconductor structure after the final diffusion step is made. In these prior art processes, a single continuous thermal oxide layer is grown on the surface of the semiconductor structure after the removal of all thermal oxide diffusion masks. This fresh layer of oxide is then cut or etched to provide openings therein through which metallization can be extended to provide electrical ohmic contact to active and passive devices within the semiconductor structure. However, the stripping of the entire oxide layer from the semiconductor structure after all diffusions are completed leaves all P-N junctions of the semiconductor structure temporarily exposed and subject to contamination. Additionally, when a new surface protective layer is reformed on the surface of the semiconductor structure, new openings must be made in this layer for base and emitter contacts. The forming of openings in the surface protective layer for these ohmic contacts can involve critical mask alignment, especially in very small geometry structures.

It would be desirable to eliminate some of these critical alignment steps necessary to provide openings in the protective surface layer for ohmic contact metallization.

It would be highly advantageous to provide a semiconductor structure wherein the protective surface layer, such as silicon dioxide, is of one uniform thickness and wherein all of the P-N junctions of the structure are not exposed prior to the formation of the final protective surface layer.

OBJECTS AND FEATURES OF THE INVENTION

An object of the present invention is to provide a new and improved high-speed passivated semiconductor device or integrated circuit (IC) and a novel process for making same.

Another object of this invention is to provide an improved semiconductor structure which is relatively easy to metallize.

Another object of this invention is to provide a novel process in which a uniform passivation layer is formed on a semiconductor structure with a minimum amount of P-N junction exposure during the process.

Another object of this invention is to provide a novel process for fabricating shallow, high concentration diffused resistor and transistor enhancement regions on thin semiconductor structures.

Another object of this invention is to provide a new and improved process of the type described wherein critical mask alignment is not required to form an opening for the emitter contact for a transistor.

The present invention features a high-speed shallow junction transistor structure and process for making same wherein one or more low temperature oxide passivation layers are formed after the formation of a transistor base region and after the diffusion mask for the base region has been completely removed.

Another feature of the present invention is the formation of a thin low temperature oxide layer on the transistor structure by thermally growing a layer of phosphorus silicate over the previously formed oxide passivation layers and over the transistor emitter region after the latter has been formed. This thin oxide layer covering the emitter region is protected by a photo-resist mask during the etching of an opening for the transistor base contact, and the thin oxide layer is subsequently removed or "washed out" by a controlled etching step. The emitter region of the transistor is thus re-exposed for ohmic electrical contact without requiring an addititional critical photo-resist and masking step. Thus, the aligment problem associated with an additional photo-resist and masking step for forming the emitter ohmic contact has been eliminated.

Another feature of the present invention is a high-speed, shallow junction transistor wherein a passivating oxide coating of uniform thickness protects the P-N junctions of the transistor. Only one P-N junction of the transistor is exposed during the fabrication thereof, so that a minimum of P-N junction exposure is maintained while forming a surface oxide coating of uniform thickness.

These and other objects and features of the invention will become more fully apparent from the following description of the accompanying drawings:

THE INVENTION

Briefly described, the present invention is directed to a high-speed, shallow junction semiconductor structure and process for making same wherein a first or transistor base region is initially formed using either a thermal oxide or a vapor deposited oxide for a diffusion mask. Next, the oxide diffusion mask is wholly removed from the semiconductor structure and fresh layers of vapor deposited oxides are formed in preparation for the diffusion of a second or transistor emitter region into the structure. The second or emitter region of the transistor is now diffused through an opening in the vapor deposited oxides. Next, a very thin protective coating is formed on the surface of the vapor deposited oxides, and an opening is made in the surface oxides to expose a base contact area. Thereafter, the thin oxide layer is removed from the transistor emitter region by controlled etching to facilitate the electrical ohmic connection thereto. In accordance with the present process, the emitter-base P-N junction of the transistor is never exposed after the formation of the second or emitter region; and the completed structure has a protective, passivating oxide coating thereon which is of uniform thickness. This uniform oxide thickness facilitates the subsequent deposition of a metallization layer on the surface of the structure, thus eliminating problems associated with stepped oxides.

Figure 1:
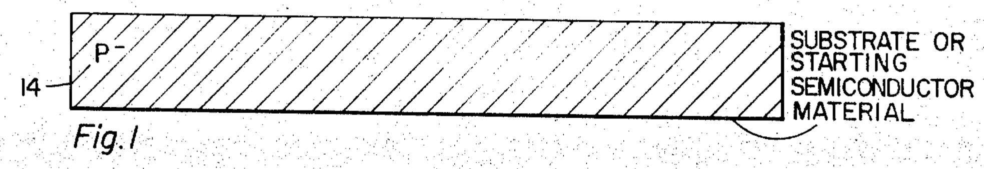
FIG. 1 illustrates the $P^-$ substrate or starting semiconductor material for the present invention.
Figure 2:
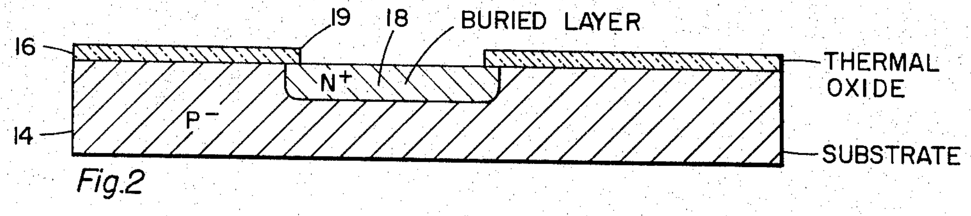
FIG. 2 illustrates the formation of an $N^+$ buried layer in the $P^-$ substrate.

Referring to the drawings in more detail, there is shown in FIG. 1 a substrate or starting semiconductor material 14. For purposes of illustration, the substrate 14 is denoted as a relatively high resistivity $P^-$ conductivity type material. All P, $P^-$ and $P^+$ conductivity type semiconductor material will be alternatively referred to herein as "one conductivity type," and all $N^+$ and N conductivity type semiconductor material will be alternatively referred to herein as "opposite conductivity type."

Using either thermal oxidation or vapor deposition techniques, an oxide layer 16 is formed over the entire surface of the substrate 14 and thereafter, using well-known photolithographic processes, an opening 19 is made in the oxide layer 16. The opening 19 enables the oxide layer 16 to serve as a diffusion mask during the formation of an $N^+$ "buried layer" 18; the use of the so-called "buried layer" is well known in the semiconductor art. The buried layer 18 permits the utilization of a relatively high resistivity epitaxial layer for the transistor collector region in order to maintain a low collector capacitance. At the same time, the collector-to-emitter saturation voltage, $V_{CE(SAT)}$, is also maintained at a relatively low value. The high collector sheet resistance is shunted by the low sheet resistance of the diffused buried layer 18, resulting in extremely low collector series resistance and thus a low $V_{CE(SAT)}$. When the diffusion of the $N^+$ buried layer 18 is complete, the thermal oxide layer 16 is removed by using, for example, an etchant containing hydrofluoric acid, HF.

Figure 3:
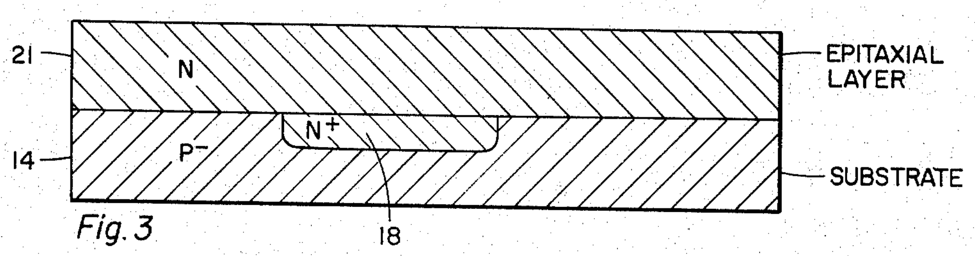
FIG. 3 illustrates the formation of an N type epitaxial layer on the $P^-$ substrate.

Referring now to FIG. 3, an N type layer 21 is epitaxially deposited on the surface of the substrate 14 and on the surface of the buried layer 18. Such an epitaxial deposition process is well known in the semiconductor art. Once the epitaxial layer 21 is formed, an oxide layer 22 is formed on the epitaxial layer 21 surface using either thermal oxidation or vapor deposition techniques. Subsequently, openings 24, 26, 28 and 30 are made in the oxide layer 22. Openings 24 and 28 permit the diffusion of a $P^+$ impurity such as boron through the epitaxial layer 21 and into the surface regions of the substrate 14. This diffusion forms a continuous annular ring 32 which provides P-N junction isolation for the integrated circuit structure of the present invention.

It is also desirable for many integrated circuit applications to provide one or more diffused resistors 31 at the same time that the $P^+$ isolation region 32 and the P type transistor base region 34 are formed. However, it should be understood that the $P^+$ isolation region 32, the $P^+$ diffused resistor 31, and the P type transistor base region 34 are only representative of many identical P type diffusions and ohmic contact $P^+$ enhancement regions (not shown) which can be made simultaneously in one diffusion process step. Thus, many transistor isolation regions and diffused resistors may be formed simultaneously in an integrated circuit structure in a single process step.

Figure 4:
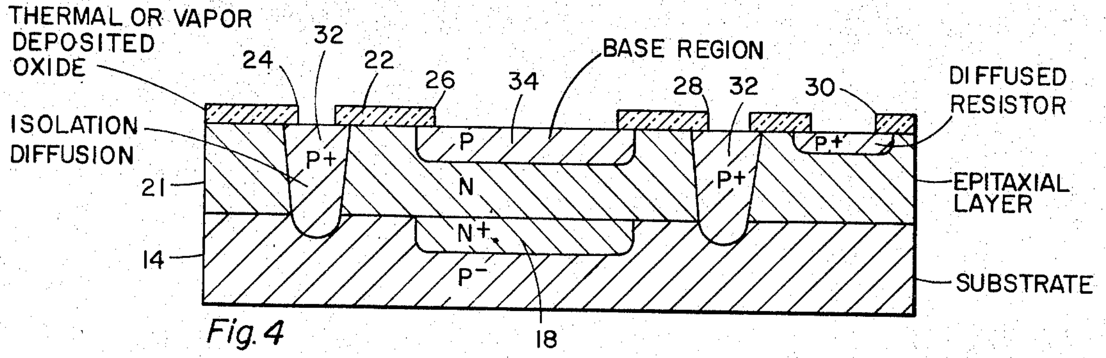
FIG. 4 illustrates the formation of a bipolar transistor base region, a $P^+$ isolation region and a $P^+$ type diffused resistor in the previously formed epitaxial layer.
Figure 5:
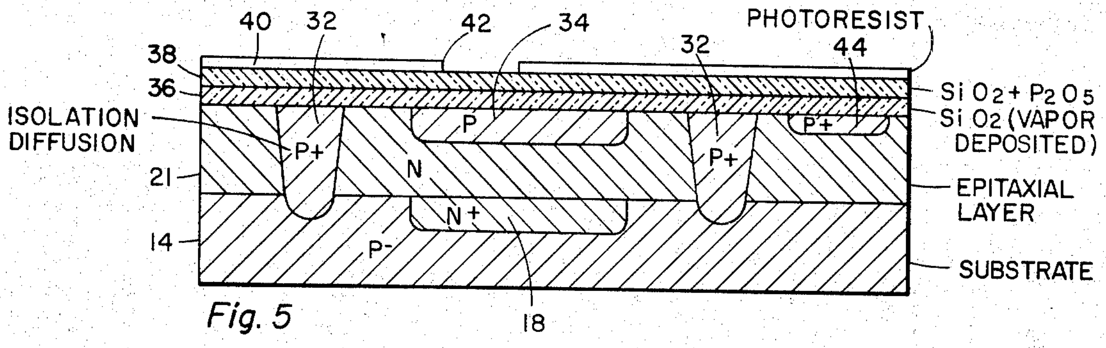
FIG. 5 illustrates the vapor deposition of multiple oxide layers on the surface of the previously formed epitaxial layer.

After all of the P diffusions such as those shown in FIG. 4 are completed, the surface oxide mask is completely removed from the surface of the semiconductor structure by using an oxide etchant such as diluted HF. Next, a fresh oxide diffusion mask is formed on the surface of the semiconductor structure as shown in FIG. 5. The oxide mask shown in FIG. 4 and previously described will be alternatively referred to herein as a first mask, and the oxide mask comprising the individual oxide layers in FIG. 5 will be alternatively referred to herein as a second mask. However, the first and second diffusion masks according to the present invention are not liimted to pure oxides. Various other types of masks such as mixed oxides, phosphorus doped oxides, and nitrides can be used within the scope of the present invention.

In FIG. 5, a first vapor deposited oxide layer 36 is formed, for example, by exposing the epitaxial layer 21 to a gaseous mixture of oxygen and silane at atmospheric pressure and at a relatively low deposition temperature ranging from between approximately 350° C. and 900° C. Preferably, a deposition temperature within the range of 400° C. to 500° C. is used. Next, a layer of the phosphorus doped oxide 38 is deposited on the initial low temperature oxide layer 36 by exposing, for example, the oxide layer 36 to a gaseous mixture of silane, phosphine, and oxygen at atmospheric pressure at a relatively low deposition temperature between approximately 400° C. and 450° C. The oxide layer 36 may typically be in the order of 5000 angstroms, and the phosphorus doped oxide layer 38 is typically in the order of 500 to 2000 angstroms.

After the surface oxide layer 36 and the phosphorus doped oxide layer 38 have been deposited to a total thickness of approximately .2 micron, a photo-resist mask 40 is formed on the surface of the low temperature oxide layer 38 using known photolithographic techniques. An opening 42 is then formed in the photo-resist mask 40, and the oxide exposed by the opening 42 is removed by etching the oxide with a suitable oxide etchant such as diluted hydrofluoric acid. When the portion of the oxide exposed by opening 42 is removed to thereby expose a surface area portion of the epitaxial layer 21, the photo-resist layer 40 is removed from the upper surface of the phosphorus doped oxide layer 38.

Next, an N type impurity opposite in conductivity to the first or base region 34 is diffused into a portion of region 34 to define a second or emitter region 48 of the transistor being fabricated. During the diffusion of the second or emitter region 48 into the semiconductor structure, a thin layer 50 of phosphorus silicate glass is thermally grown on the surface of the second region 48 and on the exposed surface of oxide layer 38. This thin layer 50 of phosphous silicate glass minimizes the diffusion depth of the emitter region 48, thereby insuring that the emitter region 48 is very shallow. Such a shallow emitter region is necessary for very high speed switching of transistors.

Figures 6, 7, 8, 9, 10:
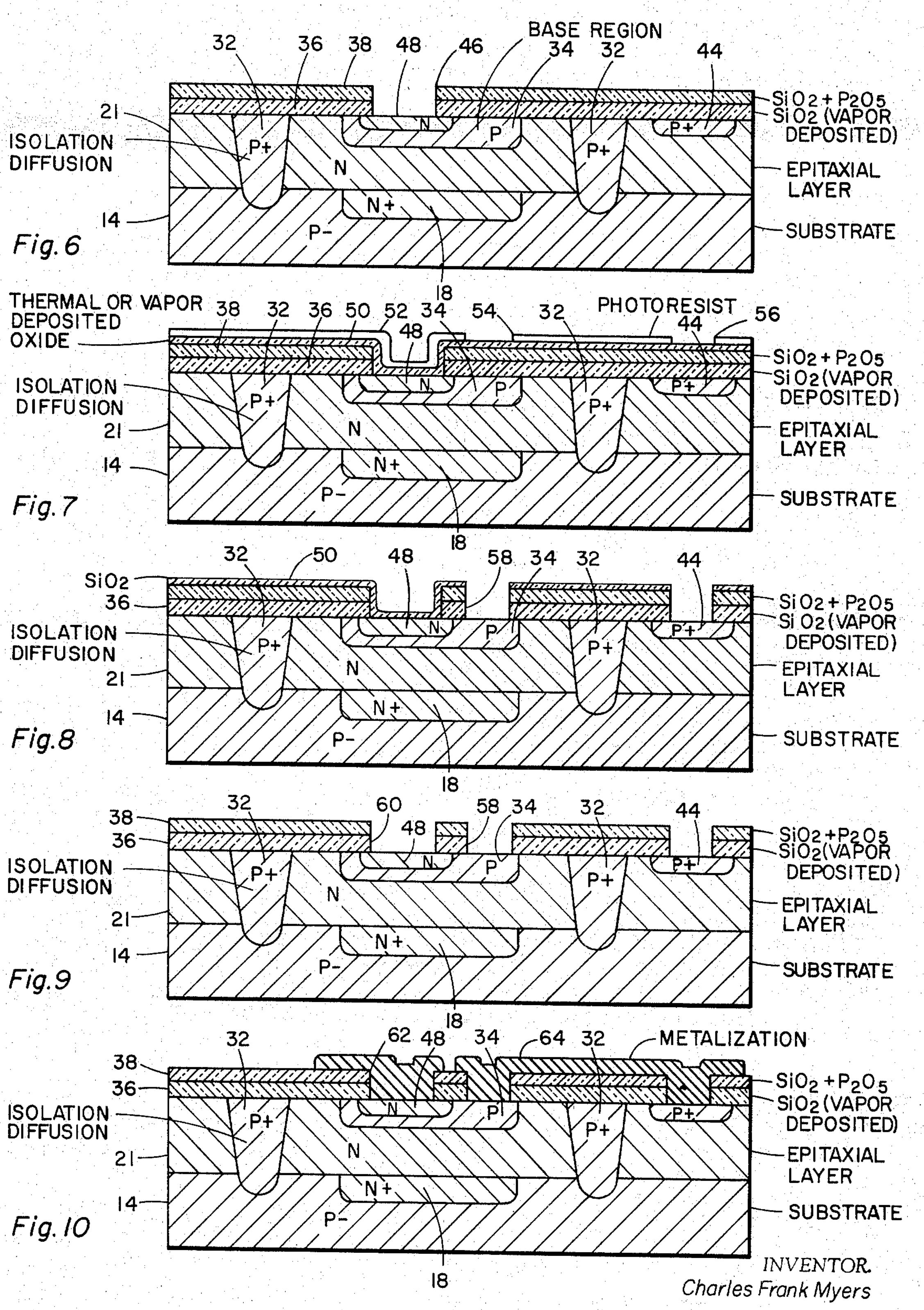
FIG. 6 illustrates the formation of a transistor emitter region within the semiconductor structure.
FIG. 7 illustrates both the formation of a very thin oxide layer on the previously formed vapor deposited oxide layers and the formation of a photo-resist masking pattern on the thin oxide layer previously formed.
FIG. 8 illustrates the selective removal of surface oxide on the semiconductor structure to expose the transistor base region in preparation for subsequent metallization step.
FIG. 9 illustrates the removal of the thin oxide layer formed in FIG. 7 to thereby expose the transistor emitter region.
FIG. 10 illustrates the completed structure fabricated in accordance with present invention and including surface metallization thereon.

The thin layer of phosphorus silicate glass 50 is now covered by a photo-resist mask 52 as shown in FIG. 7, and openings 54 and 56 are formed in the photo-resist mask 52 using known photo-resist etching techniques. These openings 54 and 56 expose portions of the oxide layers 36, 38 and 50 which are to be removed in a subsequent etching step.

By using an oxide etchant such as dilute HF, openings 58 and 59 (FIG. 8) are made; at this step in the present process, all P type regions to be contacted should be exposed by similar etchings of the surface oxide layers 36, 38 and 50. As mentioned above, the transistor and resistor illustrated in the accompanying drawings are intended to represent only two of many active and passive circuit components which may be simultaneously fabricated using the present process in a monolithic integrated circuit. Once the openings 58 and 59 have been made in the oxide layers 36, 38 and 50 as shown in FIG. 8, the photo-resist masking pattern 52 is removed using a photo-resist etchant. Two typical photo-resist etchants are known in the semiconductor industry as the J–100 and AZ–100 etchants. Then, by controllably etching the thin layer 50 of phosphorus silicate glass, the emitter window 60 may be reopened as shown in FIG. 9 to permit the subsequent deposition of metallization on the emitter surface.

One controlled etching cycle which has been used to remove the thin layer 50 is characterized by the following times, temperatures and materials: Initially, chromic acid is applied to the layer 50 for approximately 5 minutes. Next, an etchant known in the semiconductor industry as the 1514 etch is applied to the oxide layer 50 for approximately 15 seconds. The 1514 etch comprises 15 parts of ammonium fluoride, 1 part HF, and 4 parts $H_2O$. This 1514 etchant has an etch rate of approximately 30 angstroms per second. Next, the surface of the structure shown in FIG. 8 is cleaned in a nntric acid bath for approximately 5 minutes, then rinsed in deionized water and then etched for 5 more seconds in the 1514 etchant. Finally, the structure in FIG. 8 is again rinsed in deionized water to complete the transition from the structure shown in FIG. 8 to the structure shown in FIG. 9.

FIG. 10 illustrates the metal deposition of an emitter contact 62 and a strip of metallization 64 which may typically connect the first or base region 34 of the transistor with the adjacent diffused resistor 44. The strip of metallization 64, which may typically be aluminum, is evaporated over the vapor deposited oxide layers 36 and 38. Thus, electrical contact is made between the base region 34 and the diffused resistor 44 while being insulated by oxide layers 36 and 38 from the semiconductor structure therebetween.

It should be understood that the process according to the present invention is not limited to the fabrication of bipolar transistors. This process may also be used, for example, to fabricate junction field-effect transitsors. In the fabrication of a junction field-effect transistor corresponding to the bipolar transistor structure previously described, the first or base region 34 of the bipolar transistor would typically correspond in geometry to the channel region of the junction field-effect transistor. Similarly, the second or emitter region 48 of the bipolar transistor previously described would correspond to the top gate region of a junction field-effect transistor. Obviously, the metallization pattern would be different for the junction field-effect transistor since the first region 34 of the junction FET would require two contacts for the source and drain, respectively, at each end of the channel. However, these modifications are obvious to those skilled in the art.

It should also be understood that the present invention is not limited to the diffusion processes. An alternative to the diffusion process in the formation of active device regions is that of ion implantation wherein ions, such as boron ions, are accelerated in the presence of an electrical field. This high energy acceleration is effective to cause the ions to penetrate the semiconductor surface which is exposed by openings in a mask. These ions could have been used to form the first and second regions which were formed in the above-described embodiment by solid state diffusion.

Additionally, the masking steps which have been described included the use of photo-resist to form desired oxide patterns on the semiconductor surface. One photoresist material is sold under the name of KMER by the Kodak Company. However, various other oxide masking materials may be used to pattern the oxide masks within the scope of the present invention.

Finally, the diffusion masks of the present invention which are used to limit the lateral extent of the impurities introduced into the semiconductor body are not necessarily limited to oxides. Various nitrides and phosphorus doped glasses such as phosphorus silicate can be used for impurity masks within the scope of the present invention. Therefore, it should be understood that the present invention is limited only by way of the following appended claims.

What is claimed is:

1. A process for fabricating a semiconductor structure using very shallow junctions and small geometries and empolying a passivation layer of substantially uniform thickness across the surface of the wafer prior to forming a metallization layer on the wafer, comprising the steps of:

forming an impurity mask of substantially uniform thickness across the surface of said semiconductor body;

forming a first aperture in said impurity mask for exposing a portion of said semiconductor body;

forming a first region of one conductivity type within said semiconductor body, said first region being opposite in conductivity to said semiconductor body, and said first region forming a P-N junction with said body, and said P-N junction terminating at the surface of the semiconductor body under said impurity mask;

forming a thin protective layer over the exposed portion of said first region and over said impurity mask during the time of forming said first region;

forming a photoresistive mask on the surface of said thin protective layer and forming an opening in said mask for exposing a predetermined surface portion of said thin protective layer, and the exposed portion of said thin layer being positioned overlying said semiconductor body;

selectively removing the exposed portion of said thin protective layer and a corresponding portion of said second mask underlying said removed thin layer for forming a second aperture in said impurity mask and for exposing an additional portion of said semiconductor body;

controllably removing said entire thin protective layer overlying said impurity mask and said first region, for preparing said impurity mask for a subsequent metallization step, and for reopening said first aperture, and for exposing said first region within said first aperture so as not to expose said P-N junction; and forming a metallization layer over said impurity mask, and said metallization layer extending through said second mask at least within said first and said second apertures for contacting said first region and said semiconductor body respectively.

2. A process for fabricating a semiconductor structure using very shallow junctions and small geometries and employing an oxide layer of substantially uniform thickness across the surface of the wafer prior to forming the metallization layers on the wafer, comprising the steps of:

forming a first impurity mask on a surface of the semiconductor body and forming at least one opening in the mask;

forming a base region of one conductivity type within said semiconductor body by passing an impurity through an opening in said first mask;

removing said first mask from said surface of said semiconductor;

forming a second impurity mask of substantially uniform thickness across the surface of said semiconductor body;

forming a first aperture in said second mask for exposing a portion of said base region;

forming an emitter region within said base region, said emitter region being opposite in conductivity to said base region, and said emitter region forming a P-N junction with said base region, and said P-N junction terminating at the surface of the semiconductor body under said second mask;

forming a thin protective layer over the exposed portion of said emitter region and over said second mask during the time of forming said emitter region;

forming a photoresistive mask on the surface of said thin protective layer and forming an opening in said mask for exposing a predetermined surface portion of said thin protective layer, and the exposed portion of said thin layer being positioned overlying said base region;

selectively removing the exposed portion of said thin protective layer and a corresponding portion of said second mask underlying said removed thin layer for forming a second aperture in said second mask and for exposing an additional portion of said base region, which additional portion is to be used as a base contact;

controllably removing said entire thin protective layer overlying said second impurity mask and said emitter region, for preparing said impurity mask for a subsequent metallization step, and for reopening said first aperture and for exposing said emitter region within said first aperture so as not to expose said P-N junction; and forming a metallization layer over said second impurity mask, and said metallization layer extending through said second mask at least within said first and said second apertures for contacting said emitter and said base regions respectively.

3. The process defined in claim 2 which further includes:

forming a plurality of openings in said first impurity mask, and passing an impurity of said one conductivity type through said plurality of openings to thereby form isolation regions and other integrated circuit components of said one conductivity type within said semiconductor body at the same time as forming said base region.

4. The process defined in claim 2 wherein the formation of said second mask includes vapor depositing a first layer of silicon dioxide on said surface of said semiconductor body after said base region has been formed and the surface of the semiconductor body has been stripped including the removal of said first impurity mask.

5. The process defined in claim 4 which further includes vapor depositing a mixed oxide layer comprising silicon dioxide and phosphorus pentoxide on said first layer of silicon dioxide.

6. The process defined in claim 2 wherein the step of forming a second impurity mask comprises:

forming a first layer of silicon dioxide by exposing said semiconductor surface to a gaseous mixture of silane and oxygen at temperatures ranging from between 300° C. to about 900° C., and forming a second mixed oxide layer by exposing said first oxide layer to a gaseous mixture of silane, phosphine and oxygen at temperatures ranging from between about 300° C. to 900° C.

7. The process defined in claim 2 wherein the formation of said thin protective layer comprises the step of:

heating said semiconductor structure including the second impurity mask positioned thereon to a temperature of approximately between 300° C. and 900° C. for between about one and ten minutes.

8. The process defined in claim 7 wherein the removing of said thin protective layer comprises the step of:

etching said thin protective layer with a dilute hydrofluoric acid solution.

9. The process defined in claim 7 wherein the step of removing the thin protective layer comprises the step of:

etching said thin layer in a dilute hydrofluoric acid solution comprising approximately 15 parts ammonium fluoride, approximately 1 part hydrogen flouride, and approximately 4 parts $H_2O$.

10. The process defined in claim 2 wherein the formation of said thin protective layer comprises the step of:

heating said semiconductor structure including the second impurity mask positioned thereon to a temperature of approximately between 300° C. to 900° C. for between about one and ten minutes in an atmosphere containing an impurity for forming said emitter region.

11. A process for fabricating a semiconductor structure using very shallow junctions and small geometries and employing an oxide layer of substantially uniform thickness across the surface of the wafer prior to forming the metallization layers on the wafer, comprising the steps of:

forming a first impurity mask on a surface of the semiconductor body and forming at least one opening in the mask;

forming a first region of one conductivity type within said semiconductor body by passing an impurity through the opening in said first mask;

removing said first mask from said surface of said semiconductor;

forming a second impurity mask of substantially uniform thickness across the surface of said semiconductor body;

forming a first aperture in said second mask for exposing a portion of said first region;

forming a second region within said first region, said second region being opposite in conductivity to said first region, and said second region forming a P-N junction with said first region, and said P-N junction terminating at the surface of the semiconductor body under said second mask;

forming a thin protective layer over the exposed portion of said emitter region and over said second mask during the time of forming said second region;

forming a photoresistive mask on the surface of said thin protective layer and forming an opening in said mask for exposing a predetermined surface portion of said thin protective layer, and the exposed portion of said thin layer being positioned overlying said first region;

selectively removing the exposed portion of said thin protective layer and a corresponding portion of said second mask underlying said removed thin layer for forming a second aperture in said second mask for exposing an additional portion of said first region, which additional portion is to be used as a first region contact;

controllably removing said entire thin protective layer overlying said second impurity mask and said second region, for preparing said impurity mask for a subsequent metallization step, and for reopening said first aperture and for exposing said second region within said first aperture so as not to expose said P-N junction; and forming a metallization layer over said second impurity mask, and said metallization layer extending through said second mask at least within said first and said second apertures for contacting said second and said first regions respectively.

References Cited

UNITED STATES PATENTS

| | | | |
|---|---|---|---|
| 3,342,650 | 9/1967 | Seki et al. | 148—187 |
| 3,476,618 | 11/1969 | Phillips | 148—187 X |
| 3,432,417 | 3/1969 | Davidse et al. | 204—192 |
| 3,504,430 | 4/1970 | Kubo | 29—571 |
| 3,507,716 | 4/1970 | Nishida et al. | 148—187 |

L. DEWAYNE RUTLEDGE, Primary Examiner

J. M. DAVIS, Assistant Examiner

U.S. Cl. X.R.

29—578